United States Patent
St. Germain et al.

(10) Patent No.: US 7,319,266 B2
(45) Date of Patent: Jan. 15, 2008

(54) ENCAPSULATED ELECTRONIC DEVICE STRUCTURE

(75) Inventors: Stephen St. Germain, Scottsdale, AZ (US); Michael J. Seddon, Gilbert, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 71 days.

(21) Appl. No.: 11/305,526

(22) Filed: Dec. 19, 2005

(65) Prior Publication Data
US 2006/0108673 A1    May 25, 2006

Related U.S. Application Data

(62) Division of application No. 10/606,396, filed on Jun. 27, 2003, now abandoned.

(51) Int. Cl.
*H01L 23/495* (2006.01)
(52) U.S. Cl. .................. 257/676; 257/782; 257/783; 257/784
(58) Field of Classification Search ............... 257/676, 257/782–784
See application file for complete search history.

(56) References Cited

U.S. PATENT DOCUMENTS

| 6,501,162 B2 * | 12/2002 | Sakamoto et al. ......... 257/678 |
| 6,624,511 B2 * | 9/2003 | Sakamoto et al. ......... 257/734 |
| 6,713,849 B2 * | 3/2004 | Hasebe et al. ............. 257/667 |

* cited by examiner

*Primary Examiner*—Thien F Tran
(74) *Attorney, Agent, or Firm*—Kevin B. Jackson

(57) ABSTRACT

In one embodiment, an electronic device package (1) includes a leadframe (2) with a flag (3). An electronic chip (8) is attached to the flag (3) with a die attach layer (9). A trench (16) having curved sidewalls is formed in the flag (3) in proximity to the electronic chip (8) and surrounds the periphery of the chip (8). An encapsulating layer (19) covers the chip (8), portions of the flag (3), and at least a portion of the curved trench (16). The curved trench (16) reduces the spread of die attach material across the flag (3) during chip attachment, which reduces chip and package cracking problems, and improves the adhesion of encapsulating layer (19). The shape of the curved trench (16) prevents flow of die attach material into the curved trench (16), which allows the encapsulating layer (19) to adhere to the surface of the curved trench (16).

6 Claims, 5 Drawing Sheets

ENCAPSULATED ELECTRONIC DEVICE STRUCTURE

This is a division of application Ser. No. 10/606,396, filed on Jun. 27, 2003, now abandoned.

BACKGROUND OF THE INVENTION

This invention relates generally to electronic devices, and more specifically to a support substrate structure and method for forming an encapsulated electronic device.

Semiconductor chips typically are encapsulated within a device package prior to their installation into an electronic system. Leadless packaging is one type of chip packaging technology that has gained in popularity in recent years. Compared to other types of electronic packages, leadless packages have a smaller footprint and thinner profile. This makes leadless packages ideal for wireless, networking and other consumer electronic applications where tight space requirements are important.

Leadless packaging is typically based on traditional wire bonding and leadframe processes, which enables a very attractive cost structure compared to other small outline packages. By eliminating external leads, a package footprint is decreased by approximately one quarter to one half compared to similar leaded surface mount packages. Additionally, the die attach pad of a leadless package can be coupled directly to a next level of assembly such as a printed circuit board, which provides enhanced thermal performance.

There are several problems with current leadless packaging techniques that impact overall device performance. In a typical leadless packaging process flow, a semiconductor chip is attached to a metal leadframe using a solder die attach technique. When heated during the process, the die attach material spreads or flows out from beneath the chip across the leadframe. This can result in the chip tilting or rotating off of its desired location on the leadframe. When the chip tilts, regions of stress are localized in areas where the die attach material thickness is thin, which can lead to chip cracking. When a chip rotates off its desired location, alignment problems can occur during subsequent wire bond processing. Additionally, typical mold compounds or encapsulating materials do not adhere well to die attach materials, which can lead to package delamination, chip cracks, package cracks, or die attach cracks. This forces manufacturers to use smaller chips on a given leadframe to ensure sufficient bonding surface area for encapsulating material to adhere to, which is an inefficient use of space.

Accordingly, a need exists for low-cost methods and structures that reduce the spreading of die attach materials in electronic packaging processes and improve overall device performance and reliability.

DETAILED DESCRIPTION OF THE DRAWINGS

In general, the present invention pertains to electronic device packages having an electronic chip or chips attached to a support substrate or leadframe with a die attach material. More specifically, the present invention includes a support substrate with a flag and a bonding surface. An electronic chip is attached to the bonding surface with a die attach material. A continuous trench is formed in the bonding surface of the flag in proximity to the electronic chip and surrounds at fifty percent of the chip's peripheral edge. The continuous trench has curved sidewall surfaces. In a preferred embodiment, the trench surrounds the entire periphery of the electronic chip.

The location and shape of the trench controls the flow of die attach material from beneath the electronic chip thereby reducing the spread of material across the support substrate. This allows larger chips to be placed on a given flag area, and further allows chips to be placed closer together in multi-chip package applications. The shape provides a surface tension effect that minimizes or substantially eliminates the flow of die attach material into the trench itself (i.e., the flow of die attach material is impeded or stopped at about the inner edge of the trench). This provides a self-alignment feature that properly aligns or orients the electronic chip appropriately or uniformly (i.e., substantially equidistant spacing between the edges of the electronic chip and the trench) on the flag area. The shape also allows encapsulating material to flow into the trench during a molding step to provide a mold lock feature. Additionally, this provides more substrate surface area for the encapsulating material to adhere to thereby reducing delamination problems. Moreover, this provides a moisture barrier and reduces stresses associated with batch electronic packaging processes.

The present invention is better understood by referring to FIGS. 1-13 together with the following detailed description. For ease of understanding, like elements or regions are labeled the same throughout the detailed description and FIGURES where appropriate. The preferred embodiments are shown using a leadless type package, but the present invention is applicable to other forms of electronic packaging where support substrates and die attach materials are used.

Figure 1:
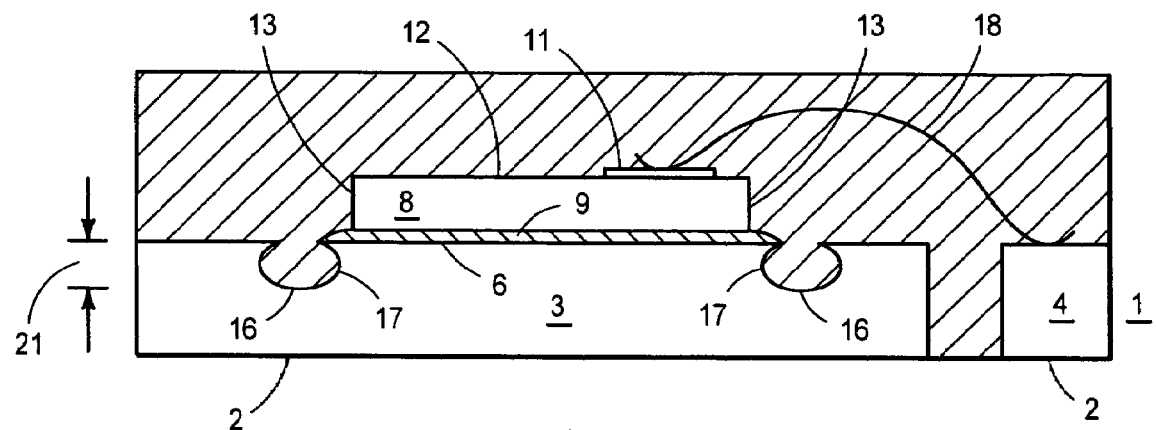
FIG. 1 illustrates, an enlarged cross-sectional view of an electronic device package according to the present invention.

FIG. 1 shows an enlarged cross-section view of an electronic device package or leadless electronic structure 1 according to the present invention. Structure 1 includes a support substrate, conductive substrate, or leadframe 2, which includes a flag or flag portion 3 and a bond pad, bond site, or bonding site 4. Flag 3 includes a bonding or attaching surface 6. Support substrate 2 comprises, for example, copper, a copper alloy (e.g., TOMAC 4, TAMAC 5, 2ZFROFC, or CDA194), a copper plated iron/nickel alloy (e.g., copper plated Alloy 42), or a like conductive material. Alternatively, support substrate 2 comprises an insulator or includes an insulative layer formed on a portion of or over flag 3.

Structure 1 further includes an electronic chip or device 8 attached or bonded to bonding surface 6 with a die or chip attach layer or material 9. Electronic chip 8 includes, for example, a bond pad 11 formed on an upper or exposed surface 12. Electronic chip 8 further includes a peripheral or outer edge 13 that defines the outer periphery of electronic chip 8. Electronic chip 8 comprises a semiconductor device, an optical device, an electromechanical sensor device, a passive device, or the like. Die attach layer 9 comprises a eutectic solder, a bonding paste, a bonding epoxy, a pre-form film, a polyimide film, a metal filled glass, or the like. In a preferred embodiment, die attach layer 9 comprises a lead/tin/silver solder material. Alternatively, die attach layer 9 comprises an insulating material when it is desired to isolate electronic chip 8 from flag 3.

According to the present invention, structure 1 further includes a trench, continuous groove, continuous trench, continuous channel or etched trench 16 formed in bonding surface 6 of flag 3 in proximity or spaced relationship to peripheral edge 13 of electronic chip 8. Continuous trench 16 includes a curved sidewall, side, or etched sidewall surface 17 adjacent to peripheral edge 13. Preferably, all sidewalls of continuous trench 16 are curved.

In a preferred embodiment, continuous trench 16 has a continuously curved or rounded or a substantially continuously curved cross-sectional shape or inner surface. Preferably, continuous trench 16 comprises an inverse "omega" like cross-sectional shape. By way of example, trench 16 has a depth 21 of at least about 76 microns (about 3 mils). Preferably, depth 21 is in range from about 100 microns (about 4 mils) to about 330 microns (about 13 mils).

Figure 2:
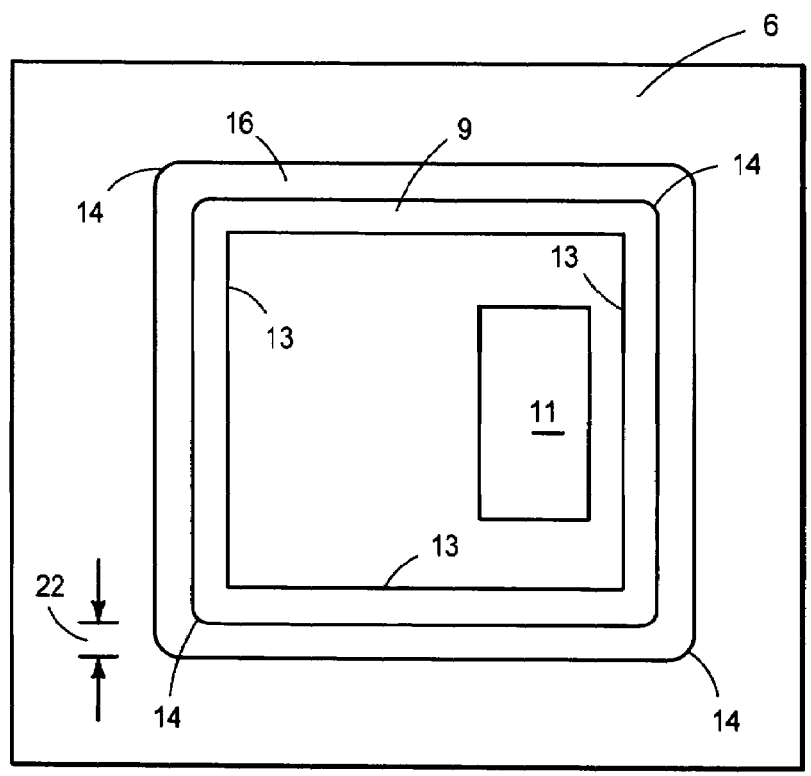
FIG. 2 illustrates, a top view of a portion of the structure shown in FIG. 1.

As shown in FIG. 1, electronic device package 1 further includes a bonding device 18 that couples or electrically connects bond pad 11 to bonding site 4. Bonding device 18 comprises for example, a bond wire or clip. An encapsulant, molded layer, protective layer, or encapsulating layer 19 covers, encloses, or encapsulates electronic chip 8, exposed portions of flag 6, bonding site 4, and at least a portion of curved sidewall surfaces 17. Preferably, encapsulating layer 19 covers substantially all of or the entire inner surface of continuous trench 16. Encapsulating layer 19 comprises, for example, an epoxy-novolac based resin material Trench 16 is continuous in that there are no breaks or terminations for a specific distance. Preferably, the specific distance is along at least fifty percent of the peripheral length (e.g., two sides and at least one corner of a rectangular shaped chip) of electronic chip 8. In a more preferred embodiment, continuous trench 16 surrounds electronic chip 8 without a break or termination as shown in FIG. 2, which is a top view of a portion of structure 1. Additionally, trench 16 preferably has rounded corners 14 as shown in FIG. 2, and a width 22 of at least about 50 microns (about 2 mils). Preferably, width 22 is in a range from about 102 microns (about 4 mils) to about 330 microns (about 13 mils).

The curved shape or contour of continuous trench 16 and its proximity to peripheral edge 13 provide several advantages. First, when electronic chip 8 is attached to bonding surface 6 with die attach material 9, continuous trench 16 prevents or restricts die attach material 9 from spreading or flowing across flag 3. By restricting the flow of die attach material, the thickness of die attach layer 9 is more uniform, which reduces die tilt problems and associated die cracking problems. Also, it allows manufacturers to use a thicker die attach layer, which also reduces package related stresses. In addition, continuous trench 16 allows manufacturers to use a larger chip on a given flag because the restricted flow effect leaves sufficient exposed bonding surface 6 for encapsulating layer 19 to adhere to. This provides a more efficient use of space and allows manufacturers to either shrink package size, or place larger chips in a given package size.

Figure 3:
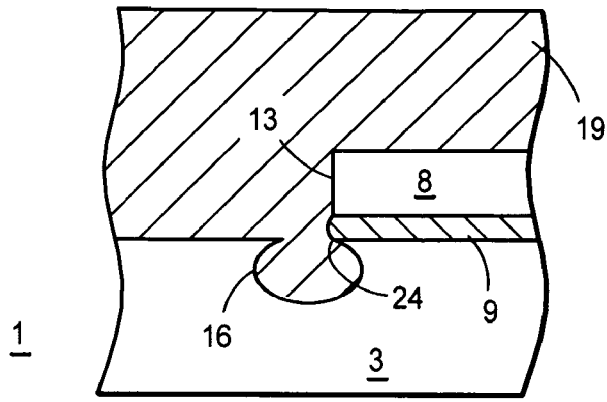
FIG. 3 illustrates, an enlarged cross-sectional view of an embodiment of the present invention.
Figure 4:
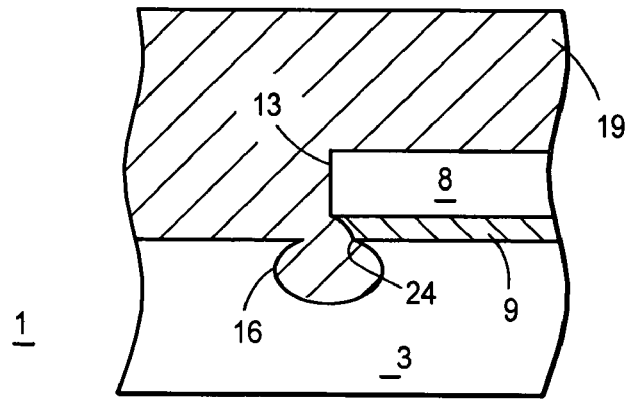
FIG. 4 illustrates, an enlarged cross-sectional view of another embodiment of the present invention.
Figure 5:
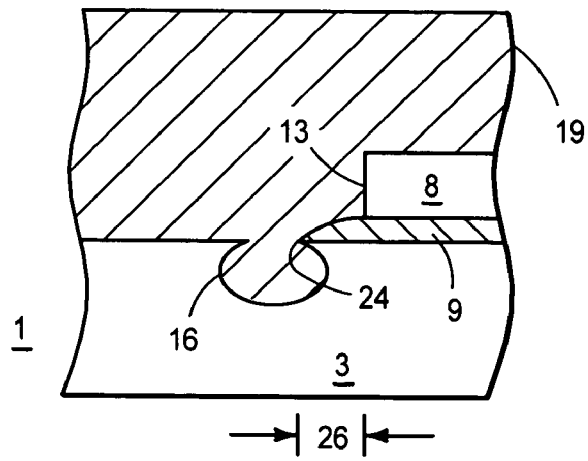
FIG. 5 illustrates, an enlarged cross-sectional view of a further embodiment of the present invention.

In particular, the shape of continuous trench 16 and its proximity to electronic chip 8 provide or create a surface tension effect that prevents or impedes die attach material 9 from spreading, flowing, or migrating beyond an inner edge of continuous trench 16 (shown as inner edge 24 in FIGS. 3-5). In other words, the surface tension effect reduces or prevents die attach material 9 from flowing or spreading into continuous trench 16 so that a leading edge or at least a portion of die attach material terminates at approximately the inner edge of continuous trench 16. As a result, trench 16 is substantially absent die attach material, which allows encapsulating layer 19 to fill continuous trench 16 to provide a mold lock. This enhances the adhesion of encapsulating layer 19 to flag 3, and further provides a moisture barrier to better protect electronic chip 8.

Continuous trench 16 solves another problem associated with the prior art. In particular, when encapsulating layer 19 comprises certain mold compounds having a high shrinkage rate, the different thermal expansion characteristics of support substrate 2 and encapsulating layer 19 result in an assembly that bows or warps in a concave-up manner. This impacts subsequent package separation processes making it difficult to saw or dice the assembly into individual packages. With encapsulating layer filling continuous trench 16, support substrate 2 becomes more of a composite structure thereby reducing the stress-induced bowing problem. This benefit also allows manufacturers to use higher shrinkage encapsulating materials than in the prior art, which improves adhesion between the encapsulating material and the support substrate. This in turn improves package reliability.

FIGS. 3-5 show enlarged cross-sectional views of alternative embodiments of a portion of electronic device package 1. In FIG. 3, peripheral edge 13 of electronic chip 8 is shown substantially aligned to an inner edge 24 of continuous trench 16. In FIG. 4, peripheral edge 13 of electronic chip 8 extends over inner edge 24 of continuous trench 16. In FIG. 5, peripheral edge 13 of electronic chip 8 is spaced a distance 26 from or inside inner edge 24. Preferably, distance 26 is less than or equal to about 635 microns (less than or equal to about 25 mils). Distance 26 is varied depending on electronic chip size and/or a desired volume or amount of die attach material needed for a selected flag geometry. According to the present invention, distance 26 is proximate to the electronic chip so that the flow of die attach material substantially terminates at the edge of the trench due to the surface tension effect. This provides the self-alignment and anti-tilt features and the other benefits of the present invention.

Figure 6:
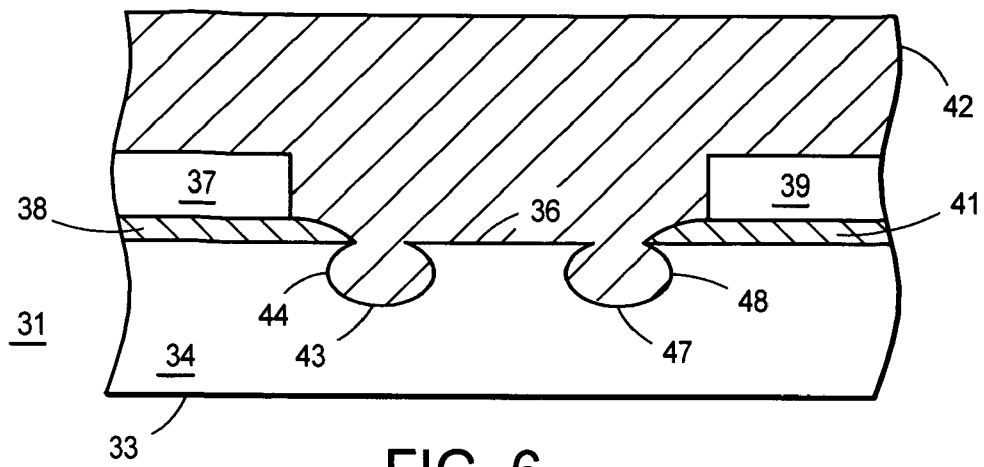
FIG. 6 illustrates, an enlarged partial cross-sectional view of an additional embodiment of an electronic device package according to the present invention.

Turning now to FIGS. 6-9, a multi-chip embodiment according to the present invention is described. FIG. 6 shows an enlarged cross-sectional view of a portion of an electronic device package 31, which includes a support substrate or leadframe 33 (partially shown) having a flag portion or flag 34. A first electronic chip 37 is attached to a bonding surface 36 of flag 34 with a die attach layer 38. A second electronic chip 39 is attached on a different portion of bonding surface 36 with a die attach layer 41. An encapsulating layer 42 covers electronic chips 37 and 39, portions of die attach layers 38 and 41, portions of bonding surface 36 and continuous trenches 43 and 47, which are described next.

According to the present invention, electronic device package 31 further includes a first continuous trench, trench, or groove 43 formed in bonding surface 36 in proximity to first electronic chip 37 and die attach layer 38. Preferably, first continuous trench 43 surrounds at least fifty percent of the periphery of first electronic chip 37. In a preferred embodiment, first continuous trench 43 surrounds the peripheral edge of first electronic chip 37.

A second continuous trench or groove 47 is formed in bonding surface 36 in proximity to second electronic chip 39 and die attach layer 41. Preferably, second continuous trench 47 surrounds at least fifty percent of the periphery of second electronic chip 39. In a preferred embodiment, second continuous trench 47 surrounds the peripheral edge of second electronic chip 39.

First and second continuous trenches 43 and 47 have curved sidewall, side, or etched sidewall surfaces 44 and 48 respectively. Preferably, continuous trenches 43 and 47 have substantially continuously curved inner surfaces. In a preferred embodiment, both continuous trenches 43 and 47 have rounded corners as shown as element 14 in FIG. 2 with continuous trench 16. Additionally, continuous trenches 43 and 47 preferably have the same depth and width characteristics as those described for trench 16.

By incorporating continuous trenches 43 and 47, the benefits described with continuous trench 16 are realized. In addition, continuous trenches 43 and 47 allow manufacturers to place multiple devices such as electronic chips 37 and 39 closer together on flag 34.

Figure 7:
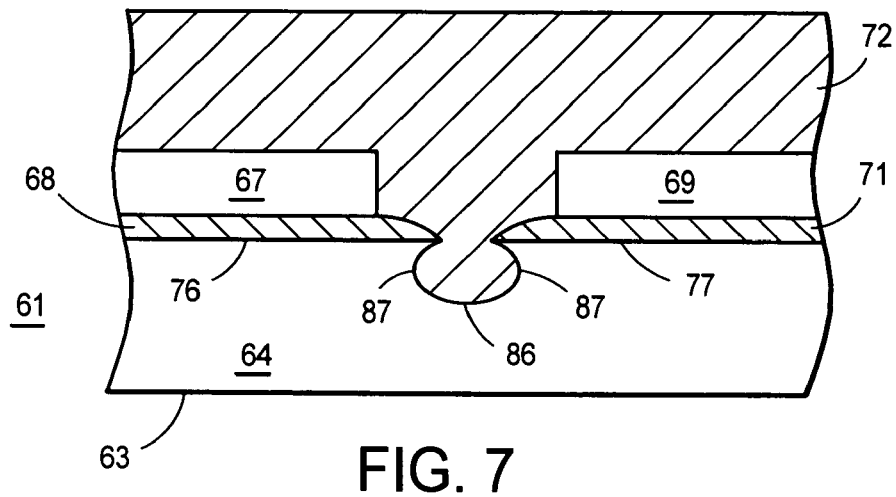
FIG. 7 illustrates an enlarged cross-sectional view of another embodiment of an electronic device package according to the present invention.

FIG. 7 shows an enlarged partial cross-sectional view of another embodiment of electronic device package 61 according to the present invention. Electronic device package 61 includes a support substrate or leadframe 63 (partially shown in FIG. 7) having a flag or flag portion 64, which has bonding surface portions 76 and 77. A first electronic chip 67 is attached to bonding surface portion 76 with a die attach layer 68. A second electronic chip 69 is attached to bonding surface portion 77 with a die attach layer 71. An encapsulating layer 72 covers electronic chips 67 and 69, portions of die attach layers 68 and 71, and continuous trenches 81, 84, and 86, which are described next.

Figure 8:
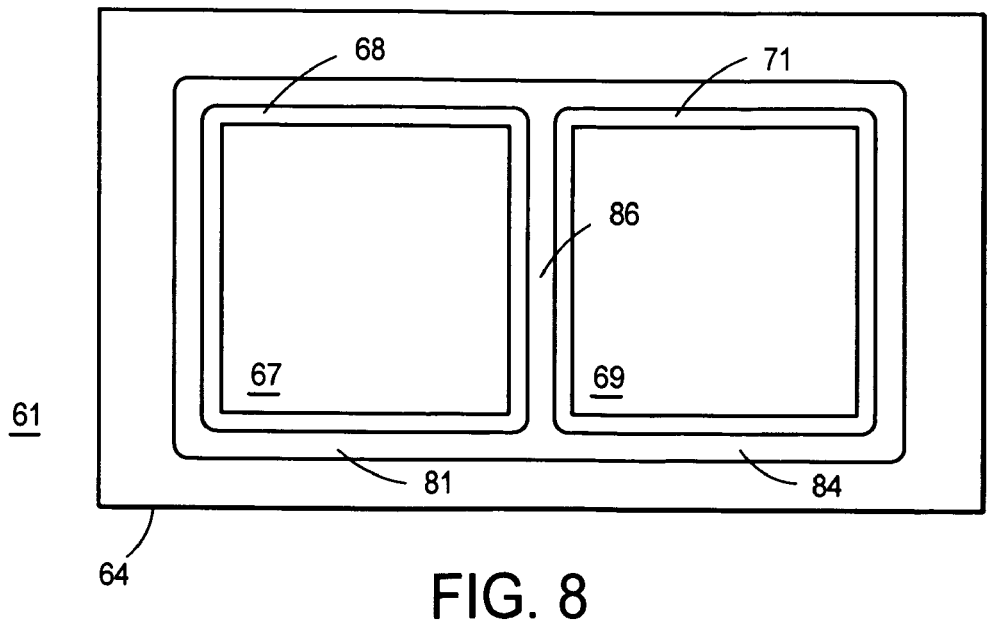
FIG. 8 illustrates a top view of the embodiment of FIG. 7.

Referring now to FIG. 8, which is a top view of a portion electronic device 61. Electronic device package 61 further includes a first continuous trench 81 that is formed in bonding surface portion 76 in proximity to the periphery of first electronic chip 67, and a second continuous trench 84 that is formed in bonding surface portion 77 in proximity to the periphery of second electronic chip 69. As shown in FIG. 8, first and second continuous trenches 81 and 84 share a common portion or common trench portion 86, which is between first and second electronic chips 67 and 69. Common trench portion 86 allows manufacturers to place electronic chips 67 and 69 closer together compared to the embodiment shown in FIG. 6.

First and second continuous trenches 81 and 84 and common trench portion 86 have curved sidewall surfaces (shown as curved surfaces 87 in FIG. 7). Preferably, continuous trenches 81, 84 and 86 have substantially continuously curved inner surfaces. In a preferred embodiment, continuous trenches 81, 84, and 86 have rounded corners as shown in FIG. 8. Additionally, continuous trenches 81, 84, and 86 preferably have the same depth and width characteristics as those described for continuous trench 16. Alternatively, trench portion 86 has a different width than trenches 81 and 84. By incorporating continuous trenches 81, 84 and 86, the benefits described with continuous trench 16 are realized.

Figure 9:
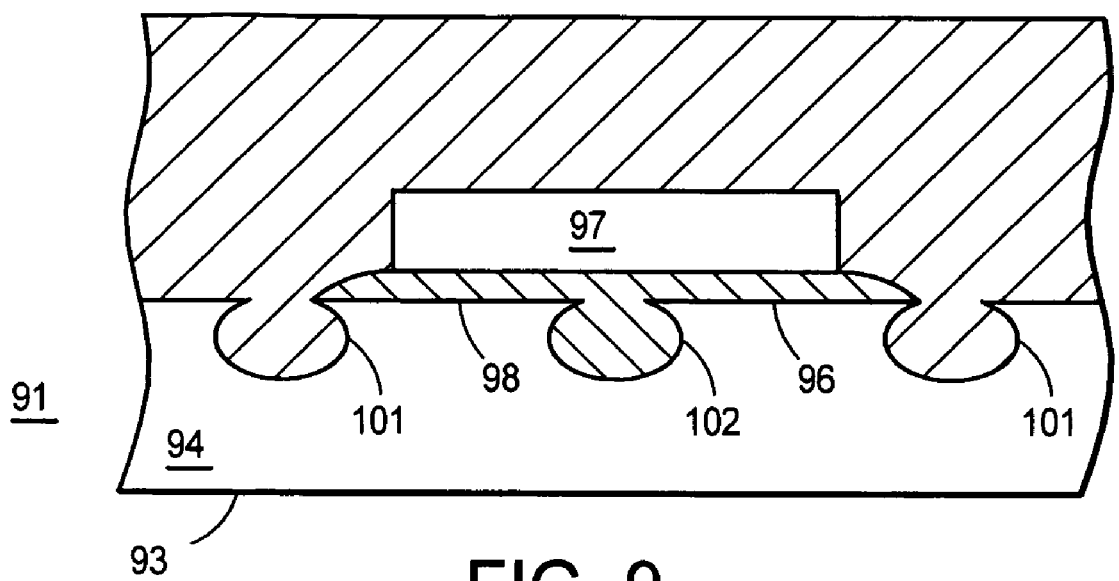
FIG. 9 illustrates an enlarged partial cross-sectional view of an alternative embodiment of an electronic device package according to the present invention

FIG. 9 shows an enlarged partial cross-sectional view of an alternative embodiment of an electronic device package 91 according to the present invention. Electronic device package 91 includes a support substrate or leadframe 93 having a flag or flag portion 94, which has a bonding surface 96. An electronic chip 97 is attached to bonding surface 96 with a die attach layer 98. A continuous trench 101 is formed in flag 94 in proximity to electronic chip 97. Continuous trench 101 has the same characteristics as those described for continuous trench 16.

Figure 10:
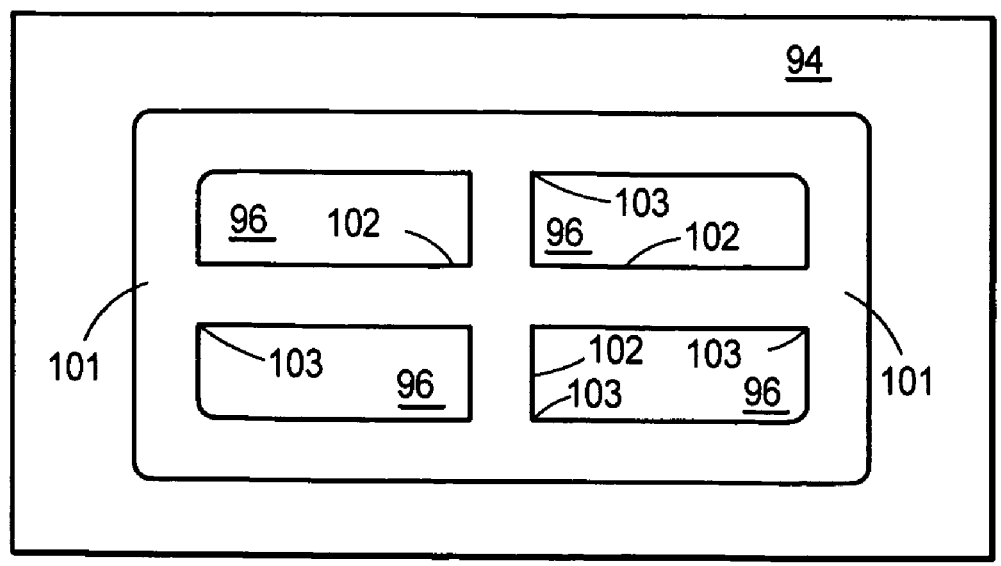
FIG. 10 is a top view including the embodiment of FIG. 9.
Figure 11:
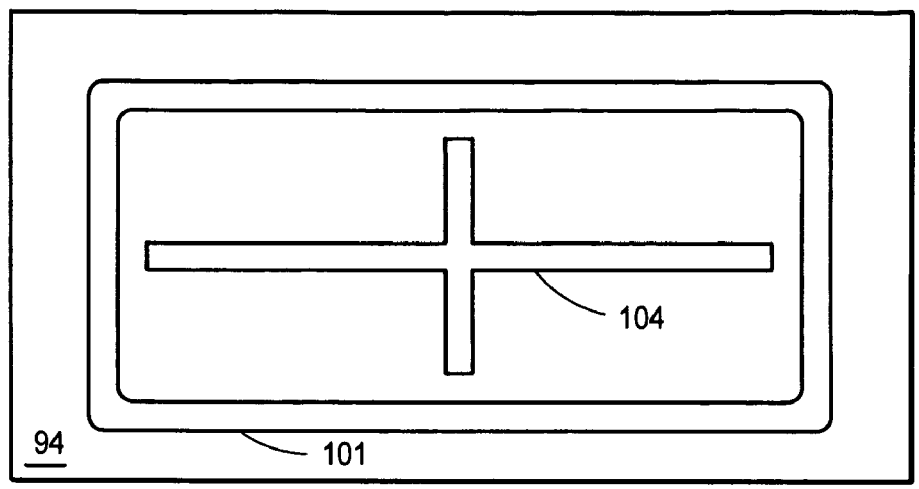
FIG. 11 is a top view of another embodiment of the structure shown in FIG. 9.

Electronic device package 91 further includes a trench or etched shape 102 formed in flag 94 beneath electronic chip 97 and die attach layer 98. That is, electronic chip 97 overlies trench 102. FIG. 10 shows a top view of flag 94, bonding surface 96, continuous trench 101, and trench 102. In this embodiment, trench 102 is coupled or connected to continuous trench 101 at intersection points 103. Preferably, trench 102 comprises a cross shape as shown in FIG. 10. Alternatively, second trench 102 has an "X" shape. In an alternative embodiment, a trench 104 is formed in flag 94, but does not connect to continuous trench 101 as shown in FIG. 11.

Trenches or shapes 102 and 104 are formed in flag 94 using either etching or stamping techniques. Trenches 102 and 104 function, for example, to collect flux used when electronic chip 97 is attached to bonding surface 96 with die attach layer 98 so that the flux does not have to be expelled out from underneath electronic chip 97. Together with continuous trench 101, this further reduces tilt and lateral movement of electronic chip 97.

Figure 12:
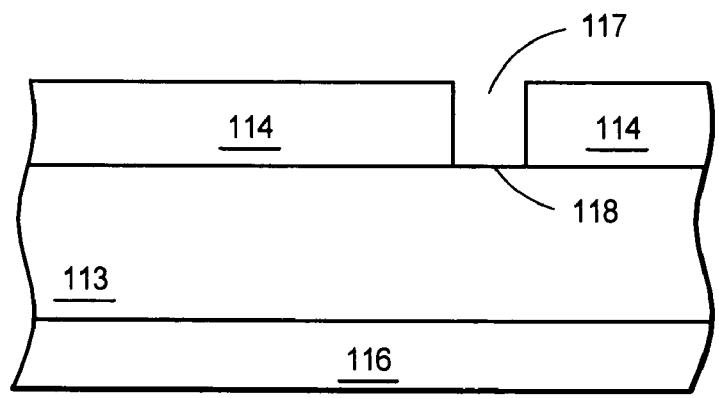
FIG. 12 illustrates an enlarged cross-sectional view of a support substrate according to the present invention at an early stage of fabrication.
Figure 13:
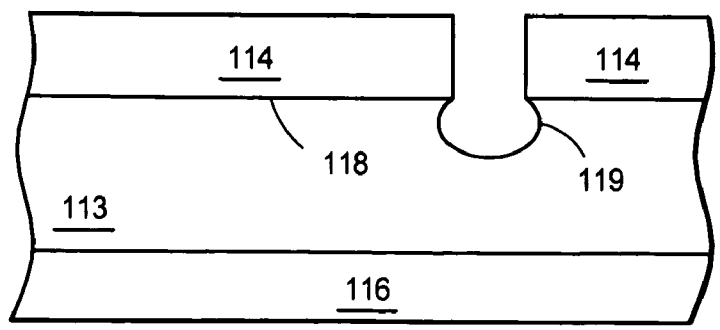
FIG. 13 illustrates an enlarged cross-sectional view of support substrate of FIG. 12 at a further stage of fabrication.

Turning now to FIGS. 12 and 13, a method for forming a continuous trench according to the present invention is described. FIG. 12 shows an enlarged cross-sectional view of a support substrate or leadframe 113 at a stage of fabrication, and includes a bonding surface and deposited or attached masking layers 114 and 116. Masking layers 114 and 116 comprise, for example, conventional photoresist materials or the like. Masking layer 114 is shown after an exposure and develop step, which provides an opening 117 in masking layer 114 to expose a portion of bonding surface 118. The shape of opening 117 depends on, for example, the size of the electronic chip to be attached to leadframe 113 and the desired spaced relationship of the electronic chip to the resultant trench formed in leadframe 113.

FIG. 13 shows leadframe 113 after a trench 119 has been etched into bonding surface 118. Trench 119 preferably is etched using a jetted etchant (i.e., an impinging jet or directed flow etch) to provide a substantially continuously curved inner surface. For example, when leadframe 113 comprises copper, a ferric chloride etchant is used to form trench 119. Once trench 119 is formed, masking layers 114 and 116 are removed, and leadframe 113 is ready for further processing.

Thus it is apparent that there has been provided, in accordance with the present invention, a structure and method for forming an electronic device package having a curved groove formed in a leadframe in proximity to an electronic chip. The curved groove provides, for example, a more reliable package by reducing the spread of die attach material from underneath the electronic chip. This reduces chip and package cracking problems and improves encapsulant adhesion. Additionally, the curved groove allows manufacturers to place larger chips on given leadframes, and to place chips closer together in multi-chip applications. Furthermore, the continuous groove provides chip alignment benefits, a moisture barrier, and a mold lock. Moreover, the curved groove allows manufacturers to use thicker die attach layers thereby further reducing package related stresses.

Although the invention has been described and illustrated with reference to specific embodiments thereof, it is not intended that the invention be limited to these illustrative embodiments. Those skilled in the art will recognize that modifications and variations can be made without departing from the spirit of the invention. For example, where the authors have referred to certain surfaces as upper or lower, such references are reversed when package orientation is reversed. Additionally, although the authors have shown two chips in a multi-chip structure, additional chips with or without additional curved grooves can be used. Moreover, although a groove with a square shape (FIG. 2) is shown, the groove shape preferably substantially follows the shape of the electronic chip used. For example, the groove shape is rectangular, elliptical, oval, circular, a polygon, or the like. Therefore, it is intended that this invention encompass all such variations and modifications as fall within the scope of the appended claims.

We claim:
1. An electronic device package comprising:
   a support substrate including a flag, wherein the flag has a bonding surface;
   a first electronic chip having a first peripheral edge, wherein the first electronic chip is attached to a first portion of the bonding surface with a first die attach material;
   a first continuous trench for restricting flow of the first die attach material on the bonding surface, wherein the first continuous trench is formed in the flag in proximity to the first peripheral edge and extending only partially into the flag, wherein the first continuous trench includes a continuously rounded cross-sectional shape, a curved sidewall surface, and an inner edge substantially aligned to the first peripheral edge, and wherein the first continuous trench surrounds the first electronic chip, and wherein the first die attach material terminates at approximately the inner edge; and
   an encapsulant covering the first electronic chip and at least a portion of the curved sidewall surface.

2. The package of claim 1, wherein the first continuous trench has a width between about one hundred two microns and about three hundred thirty microns.

3. The package of claim 1, wherein the first continuous trench has a cross-sectional shape comprising an inverse omega shape.

4. The package of claim 1, wherein the first continuous trench has a rounded corner.

5. The package of claim 1, wherein the first continuous trench has depth in range from about 100 microns to about 330 microns.

6. A leadless electronic structure comprising:
   a leadframe including a bonding site and a flag having a bonding surface;
   a first semiconductor device having a first peripheral edge coupled to the bonding surface with a first chip attach layer, wherein the first semiconductor device includes a bond pad;
   a first groove for controlling flow of the first chip attach layer, wherein the first groove is formed in the bonding surface surrounding the first semiconductor device and extending only partially into the flag, wherein the first groove comprises a substantially continuously curved inner surface and a first inner edge at the bonding surface substantially aligned with the first peripheral edge, and wherein at least a portion of first chip attach layer extends across the bonding surface and terminates at approximately the first inner edge;
   a bonding device coupling the bond pad to the bonding since; and
   an encapsulating layer covering portions of the flag, the bonding site, and the bonding device, the first semiconductor device, and at least a portion of the substantially continuously curved inner surface.

* * * * *